United States Patent
Matsukizono

(10) Patent No.: US 7,968,889 B2
(45) Date of Patent: Jun. 28, 2011

(54) SEMICONDUCTOR DEVICE WITH THINNED GATE INSULATING FILM AND POLYCRYSTAL SEMICONDUCTOR LAYER AND PRODUCTION METHOD THEREOF

(75) Inventor: Hiroshi Matsukizono, Kizugawa (JP)

(73) Assignee: Sharp Kabushiki Kaisha, Osaka (JP)

(*) Notice: Subject to any disclaimer, the term of this patent is extended or adjusted under 35 U.S.C. 154(b) by 593 days.

(21) Appl. No.: 11/997,344

(22) PCT Filed: Jul. 24, 2006

(86) PCT No.: PCT/JP2006/314552
§ 371 (c)(1),
(2), (4) Date: Jan. 30, 2008

(87) PCT Pub. No.: WO2007/052393
PCT Pub. Date: May 10, 2007

(65) Prior Publication Data
US 2010/0025691 A1 Feb. 4, 2010

(30) Foreign Application Priority Data
Nov. 2, 2005 (JP) .................... 2005-319834

(51) Int. Cl.
*G02F 1/133* (2006.01)
(52) U.S. Cl. .......................... 257/72; 257/59
(58) Field of Classification Search .......... 257/59, 257/72
See application file for complete search history.

(56) References Cited

U.S. PATENT DOCUMENTS

| | | | |
|---|---|---|---|
| 6,677,222 B1 * | 1/2004 | Mishima et al. | 438/488 |
| 2002/0047169 A1 | 4/2002 | Kunikiyo | |
| 2003/0080100 A1 | 5/2003 | Yamazaki et al. | |
| 2003/0137621 A1 * | 7/2003 | Zhang et al. | 349/106 |
| 2005/0250308 A1 * | 11/2005 | Yamaguchi et al. | 438/618 |

FOREIGN PATENT DOCUMENTS

| | | |
|---|---|---|
| JP | 09-252136 | 9/1997 |
| JP | 2000-133634 | 5/2000 |
| JP | 2001-060551 | 3/2001 |
| JP | 2001-127302 | 5/2001 |
| JP | 2002-076336 | 3/2002 |
| JP | 2002-343976 | 11/2002 |
| JP | 2003-178996 | 6/2003 |
| JP | 2005-057042 | 3/2005 |
| JP | 2005-285827 | 10/2005 |

OTHER PUBLICATIONS

International Search Report for PCT/JP2006/314552 mailed Sep. 12, 2006.

* cited by examiner

*Primary Examiner* — Thomas L Dickey
(74) *Attorney, Agent, or Firm* — Nixon & Vanderhye P.C.

(57) ABSTRACT

The present invention provides a semiconductor device having a high breakdown voltage and high reliability even if a gate electrode is formed to be thin. The present invention is a semiconductor device including a polycrystal semiconductor layer, a gate insulating film, and a gate electrode, stacked on an insulating substrate in this order, wherein the polycrystal semiconductor layer has a surface roughness of 9 nm or less, the gate insulating film has a multilayer structure including a silicon oxide film on the polycrystal semiconductor layer side and a film containing a material with a dielectric constant higher than a dielectric constant of silicon oxide on the gate electrode side.

14 Claims, 3 Drawing Sheets

(a)

(b)

(c)

(d)

(e)

SEMICONDUCTOR DEVICE WITH THINNED GATE INSULATING FILM AND POLYCRYSTAL SEMICONDUCTOR LAYER AND PRODUCTION METHOD THEREOF

This application is the U.S. national phase of International Application No. PCT/N2006/314552 filed 24 Jul. 2006 which designated the U.S. and claims priority to JP 2005-319834 filed 2 Nov. 2005, the entire contents of each of which are hereby incorporated by reference.

TECHNICAL FIELD

The present invention relates to semiconductor devices and production methods thereof. More specifically, the present invention relates to a semiconductor device including a thin film transistor and the like, which is preferably used in a display device such as a liquid crystal display device, and a production method of such a semiconductor device. Further, the present invention relates to a display device including the semiconductor device or a semiconductor device produced by the method.

BACKGROUND ART

Semiconductor devices are active element-including electronic devices that utilize electrical characteristics of a semiconductor. Such semiconductor devices have been widely applied to audio-visual apparatuses, communication facilities, computers, and electrical household appliances. Among them, semiconductor devices including a three-terminal active element such as a thin film transistor (also referred to as "TFT") have been widely used in various fields. Such semiconductor devices have been used as a switching element, a control circuit and the like in a display device such as an active matrix liquid crystal display device (herein after, also referred to as "liquid crystal display").

A reduction in power consumption has been strongly needed for such TFT-including semiconductor devices, which is used in liquid crystal displays and the like, recently. Also for the TFT, a reduction in power consumption has been needed. To finely form each member of the TFT may be mentioned as a method of reducing power consumption of the TFT. It is essential to reduce a threshold voltage (Vth) of the TFT by thinning a gate insulating film disposed between a semiconductor layer and a gate electrode. A silicon oxide film excellent in interface characteristics is generally used as the gate insulating film. A low threshold operation of the TFT is permitted if the gate insulating film having a single layer structure consisting of a silicon oxide film is formed to have a small thickness. However, in this case, a breakdown voltage of the gate insulating film is reduced and defects such as an increase in leakage current between the semiconductor layer and the gate electrode tend to be generated.

Polysilicon (herein after, also referred to as "p-Si") has been recently used as the semiconductor layer of the TFT used in a liquid crystal display, which realizes a liquid crystal display in which peripheral driver circuits such as a driving circuit and a control circuit, and a pixel part are integrally formed on a substrate, a so-called monolithic liquid crystal display. As a method of forming p-Si on the substrate, a method of crystallizing amorphous silicon (herein after, also referred to as "a-Si") by laser irradiation, a so-called laser annealing method has been commonly used. However, in this method, a large projection is generated on the p-Si layer surface, and therefore if the gate insulating film is thinned, coverage characteristics of the gate insulating film for the p-Si layer (herein after, also referred to as "coverage of the gate insulating film") is particularly deteriorated. Electric field concentration often occurs at the end of the projection, which further reduces the breakdown voltage. As a result, defects such as insulating breakdown and leakage current tend to be caused in TFTs including polysilicon as a semiconductor layer (herein after, also referred to as "p-TFT"). Accordingly, a liquid crystal display including a p-TFT as a switching element has room for improvement because defects such as point defects in a panel at an initial state and reliability defects of the device are increased, thereby reducing the yield.

For this problem, a technology in which a polycrystal silicon thin film is isotropically etched using plasma gas to be flattened is disclosed (for example, refer to Patent Document 1). A technology in which recrystallization energy is provided for the polycrystal silicon layer by laser irradiation and the like to form a flattened polycrystal silicon layer is disclosed (for example, refer to Patent Document 2). Further, a technology in which an amorphous semiconductor film (amorphous silicon thin film) formed on the first thin film (silicon oxide film) and the second thin film is heated by laser to form a uniform and flattened polycrystal semiconductor film (polycrystal silicon thin film) having a large crystal particle diameter is disclosed (for example, refer to Patent Document 3). According to these, the p-Si layer is flattened, and therefore, defects such as insulating breakdown and leakage current may be suppressed. However, the effect of suppressing a reduction in breakdown voltage when the gate insulating film is thinned is insufficient.

Accordingly, the semiconductor device including a flattened polycrystal semiconductor such as polysilicon in a semiconductor layer has room in order to prevent a reduction in withstand voltage even if the gate insulating film is thinned.

[Patent Document 1]
Japanese Kokai Publication No. 2000-133634
[Patent Document 2]
Japanese Kokai Publication No. 2001-60551
[Patent Document 3]
Japanese Kokai Publication No. 2001-127302

DISCLOSURE OF INVENTION

The present invention has been made in view of the above-mentioned state of the art. The present invention has an object to provide a semiconductor device that has a high breakdown voltage and high reliability even if a gate electrode is formed to be thin. The present invention also has an object to provide a production method thereof, and a display device including the semiconductor device or a semiconductor device produced by the method.

The present inventor made various investigations on semiconductor devices having a high breakdown voltage and high reliability, and noted configurations of a polycrystal semiconductor layer such as a polysilicon layer, and a gate insulating film. They found that according to conventional semiconductor devices including a just flattened polycrystal semiconductor layer, the coverage of the gate insulating film at the pattern edge of the polycrystal semiconductor layer is insufficient, which causes a reduction in breakdown voltage. In addition, the present inventor found that if the polycrystal semiconductor layer has a surface roughness of 9 nm or less; and the gate insulating film has a multilayer structure including a silicon oxide film on the polycrystal semiconductor layer side and a film containing a material having a dielectric constant higher than that of silicon oxide on the gate electrode side, a semiconductor device having a high breakdown voltage and high reliability can be provided even if the gate electrode is formed to be thin. As a result, the above-mentioned problems have been admirably solved, leading to completion of the present invention.

That is, one aspect of the present invention is directed to a semiconductor device including a polycrystal semiconductor layer, a gate insulating film, and a gate electrode, stacked on an insulating substrate in this order, wherein the polycrystal semiconductor layer has a surface roughness of 9 nm or less, the gate insulating film has a multilayer structure including a silicon oxide film on a polycrystal semiconductor layer side and a film containing a material with a dielectric constant higher than a dielectric constant of silicon oxide on a gate electrode side.

The aspects of the present invention are mentioned below in more detail.

The semiconductor device of one or more aspects of the present invention has a structure in which a polycrystal semiconductor layer, a gate insulating film, and a gate electrode are stacked on an insulating substrate in this order. The semiconductor device includes a TFT having a so-called top gate structure on the substrate. The material for the polycrystal semiconductor layer is not limited, but polysilicon is preferable. That is, it is preferable that the above-mentioned polycrystal semiconductor layer is a polysilicon layer. It is preferable that the above-mentioned polycrystal semiconductor layer has a channel region that faces the gate electrode, and a source/drain in a region other than a region facing the gate electrode. Into the source and drain region of the polycrystal semiconductor layer, N-type or P-type impurities are doped. It is preferable that the gate electrode contains a metal with a high melting point in order to suppress plastic deformation such as hillock, generated in a heat treatment process. For example, compounds containing a metal with a high melting point such as tantalum (Ta), tungsten (W), and molybdenum (Mo), or a nitride of the above-mentioned metal with a high melting point may be used. The gate electrode may have a multilayer body containing a plurality of the above-mentioned materials. The insulating substrate is not especially limited as long as it has an insulating surface, but a glass substrate is preferably used.

The above-mentioned polycrystal semiconductor layer has a surface roughness of 9 nm or less and preferably 6 nm or less, and more preferably 4 nm or less. Thus, the polycrystal semiconductor layer in an aspect of the present invention has a small projection on the surface, and the surface is sufficiently flattened. Therefore, even if the gate insulating film is thinned, the breakdown voltage is not reduced. Accordingly, a semiconductor device having high reliability can be realized. In one or more aspects of the present description, the surface roughness means an arithmetic mean deviation (Ra) and it can be calculated according to JIS B 0601 measurement method using an Atomic Force Microscope (AMF). If the surface roughness of the polycrystal semiconductor layer exceeds 9 nm, defects such as an increase in leakage current and a reduction in breakdown voltage can be insufficiently suppressed even if the gate insulating film having a multilayer structure is used.

The above-mentioned gate insulating film has a multilayer structure including a silicon oxide film on the polycrystal semiconductor layer side and a film containing a material with a dielectric constant higher than that of silicon oxide (herein after, also referred to as "film with a high dielectric constant") on the gate electrode side. As a result, the gate insulating film of an aspect of the present invention has a thickness larger than that of a gate insulating film having a single silicon oxide film structure at the same capacitance. Therefore, not only at the upper part of the polycrystal semiconductor layer but also at the end part thereof, the coverage of the gate insulating film can be improved. As a result, the breakdown voltage and the reliability of the semiconductor device can be improved. The silicon oxide film is formed on the polycrystal semiconductor layer side, and therefore if a polysilicon semiconductor layer is used as the polycrystal semiconductor layer, excellent interface characteristics between the polysilicon layer and the gate insulating film can be secured. According to the semiconductor device of one or more aspects of the present invention, the gate insulating film can be thinned because of its excellent coverage, and therefore, a low threshold operation of the semiconductor device, that is, a reduction in power consumption can be permitted.

The configuration of the semiconductor device is not especially limited as long as it essentially includes such components. The semiconductor device may or may not include other components.

Preferable embodiments of the semiconductor device according to the present invention are mentioned in more detail below.

In one or more aspects of the present invention, it is preferable that the film containing a material with a dielectric constant higher than a dielectric constant of silicon oxide is a silicon nitride film. As the silicon nitride constituting the silicon nitride film, SiNx (x is any value) is mentioned, for example. Among them, trisilicon tetranitride ($Si_3N_4$) and silicon oxynitride are preferably used. Examples of the material with a dielectric constant higher than that of silicon oxide other than silicon nitride include titanium dioxide ($TiO_2$), dialuminum trioxide ($Al_2O_3$), tantalum oxides such as ditantalum pentoxide ($Ta_2O_5$), hafnium dioxide ($HfO_2$) and zirconium dioxide ($ZrO_2$). The dielectric constant of the material constituting the above-mentioned film with a high dielectric constant is preferably 1.5 times or more as large as a dielectric constant of silicon oxide. The embodiment of the above-mentioned film with a high dielectric constant may be a multilayer body consisting of a plurality of the above-mentioned compounds. In view of simplification of the production steps, the film with a high dielectric constant has a single layer structure. If the above-mentioned film with a high dielectric constant has a multilayer structure consisting of a plurality of the above-mentioned compounds, it is preferable that an average dielectric constant of the compounds is 1.5 times or more as large as a dielectric constant of silicon oxide.

In one or more aspects of the present invention, the method of forming the above-mentioned silicon oxide film and the above-mentioned film with a high dielectric constant is not especially limited. A normal pressure CVD (Chemical Vapor Deposition) method, a low pressure CVD method, a plasma CVD method, and a remote plasma CVD method and the like may be used. The raw material gas for forming the silicon oxide film is not especially limited, but ethyl silicate (TEOS: tetraethoxysilane) is preferable. If the film with a high dielectric constant is made of silicon nitride, a mixed gas of monosilane ($SiH_4$) and ammonia ($NH_3$) may be used as a raw material gas.

In one or more aspects of the present invention, it is preferable that the silicon oxide film has a thickness larger than a thickness of the film containing a material with a dielectric constant higher than silicon oxide in a region where the polycrystal semiconductor layer faces (overlaps with) the gate electrode. In the region where the polycrystal semiconductor layer faces the gate electrode, it is more preferable that a film thickness ratio of T1/T2 is 1.2 or more where the film thickness of the silicon oxide film is defined as T1 and the film thickness of the film with a high dielectric constant is defined as T2. Commonly, the film with a high dielectric constant such as a silicon nitride film contains many fixed charges. Accordingly, in accordance with the TFT including a gate insulating film into which silicon nitride and the like is introduced, the threshold voltage tends to be largely shifted to the low voltage side to increase an off-current. The fixed charges tend to accumulate particularly at the interface between the silicon oxide film and the film with a high dielectric constant. For this problem, as mentioned above, the silicon oxide film on the polycrystal semiconductor layer side is formed to have a thickness larger than that of the film with a high dielectric constant, thereby effectively reducing the off-current of the TFT, generated by the fixed charges.

In one or more aspects of the present invention, it is preferable that the polycrystal semiconductor layer has a forward tapered cross section and the cross section has a taper angle of 45° or more. The taper angle is more preferably 50° or more and still more preferably 55° or more. Further, it is preferable that the polycrystal semiconductor layer has a forward tapered cross section and the cross section has a taper angle of 75° or less. The taper angle is more preferably 70° or less and still more preferably 65° or less. If the polycrystal semiconductor layer has a forward tapered cross section, generation of cracks in the gate insulating film at the polycrystal semiconductor layer end can be effectively suppressed. The forward tapered cross section means that the width of the cross section of the polycrystal semiconductor layer decreases toward the upper direction (with distance from the insulating substrate). If the taper angle is 45° or more, generation of a parasitic transistor can be effectively suppressed. If the taper angle is large, an area of the polycrystal semiconductor layer when viewed from the substrate normal direction can be reduced, and therefore the TFT can be downsized. In contrast, if the taper angle is 75° or less, a reduction in coverage of the gate insulating film at the polycrystal semiconductor layer end can be effectively suppressed. If the taper angle of the polycrystal semiconductor layer is less than 45°, generation of the parasitic transistor might significantly deteriorate TIT characteristics. If the taper angle of the polycrystal semiconductor layer is more than 75°, the polycrystal semiconductor layer has a too precipitous end. Therefore, the gate insulating film on the polycrystal semiconductor layer insufficiently covers the end, and thereby defects such as a short-circuit between the polycrystal semiconductor layer and the gate electrode might be generated.

An aspect of the present invention is directed to a method for producing the semiconductor device, including a crystallization step of forming the polycrystal semiconductor layer by crystallizing an amorphous semiconductor layer with laser. According to this, the amorphous semiconductor layer can be crystallized through a low-temperature process. Accordingly, an inexpensive glass substrate can be used as the insulating substrate, thereby reducing production costs. The material for the amorphous semiconductor layer is not especially limited, and amorphous silicon (a-Si) is preferable. That is, it is preferable that the above-mentioned amorphous semiconductor layer is an amorphous silicon layer. The laser is not especially limited, and pulse oscillation laser such as KrF excimer laser (wavelength: 248 nm), XeCl excimer laser (wavelength: 308 nm) may be mentioned. The energy density of the laser irradiation is not especially limited. If the amorphous silicon layer is used as the amorphous semiconductor layer, the energy density is preferably 200 mJ/cm$^2$ or more and 550 mJ/cm$^2$ or less, and more preferably 350 mJ/cm$^2$ or more and 500 mJ/cm$^2$ or less. As a result, a polysilicon layer with a large crystal particle diameter can be obtained. It is preferable that the energy density of the laser irradiation is appropriately determined in view of a-Si layer thickness, a pulse width (time width of one-shot pulse), a beam shape on the silicon layer, an overlap ratio (a ratio of an overlap part of an irradiated region by a shot of the laser with an irradiated region by the next shot of the laser relative to an irradiated region by one shot of the laser), and whether or not the substrate is heated. If the energy density of the laser irradiation is less than 200 mJ/cm$^2$, the a-Si layer might not be crystallized. If it is more than 550 mJ/cm$^2$, the polysilicon layer might be finely crystallized.

In an example production method of the semiconductor device of the present invention, it is preferable that laser irradiation is performed at least twice in the crystallization step. According to this, the large projection formed on the polycrystal semiconductor layer surface when the first laser irradiation can be effectively reduced by the second laser irradiation, thereby flattening the polycrystal semiconductor layer surface. As a result, if the gate insulating film is formed to be thin, defects such as a reduction in breakdown voltage and an increase in leakage current can be effectively suppressed. Therefore, a yield of production of the semiconductor device can be improved. The energy density at the first and second laser irradiations may be appropriately determined.

An aspect of the present invention is directed to a method for producing the semiconductor device, wherein the gate insulating film having the multilayer structure is continuously formed in the same equipment while vacuum is maintained. According to this, the gate insulating film having a multilayer structure of the present invention can be formed without especially complicating the film formation steps in comparison to the steps of forming the gate insulating film consisting of a single layer. Accordingly, the production process of the semiconductor device can be simplified. As a result, the productivity can be secured and simultaneously an increase in production costs can be prevented. Further, contamination of the interface between the silicon oxide film and the film with a high dielectric constant can be prevented when the gate insulating film is formed. Therefore, a quality gate insulating film can be formed. If the films constituting the gate insulating film are continuously formed, the film with a high dielectric constant is preferably made of silicon nitride. The vacuum in the present description means a pressure of 500 Pa or less and preferably 300 Pa or less.

An aspect of the present invention is directed to a display device including the above-mentioned semiconductor device. The semiconductor device of the present invention has a high withstand voltage and excellent reliability. Therefore, generation of the defects in the display device can be effectively reduced. As a result, a yield of the production process of the display device can be improved. Therefore, the display device of the present invention is generally preferable for a liquid crystal display device or an organic electroluminescent display device including a TFT as a switching element on a substrate. Other preferable examples of the semiconductor device of the present invention include a device including a TFT and/or a CMOS-including circuit, an integrated circuit (IC), and a solar cell.

EFFECT OF THE INVENTION

According to one or more aspects of the present invention, the polycrystal semiconductor layer of a semiconductor device has a surface roughness of 9 nm or less, and as a gate insulating film, the silicon oxide film is formed on the polycrystal semiconductor layer side and the film with a high dielectric constant is formed on the gate electrode side. Therefore, even if the gate insulating film is formed to be thin, the gate insulating film has excellent coverage for the upper and end parts of the polycrystal semiconductor layer. As a result, a semiconductor device having a high breakdown voltage and high reliability can be realized. Further, the gate insulating film has excellent coverage, and therefore the gate insulating film can be formed to be thin. As a result, a low threshold operation of the semiconductor device, that is, a reduction in power consumption is permitted.

BEST MODES FOR CARRYING OUT THE INVENTION

Various embodiments of the present invention are mentioned in more detail below with reference to drawings, but the present invention is not limited to only these Embodiments.

Embodiment 1

A method for producing a thin film transistor (TFT) in Embodiment 1 in accordance with a semiconductor device of the present invention is mentioned below with reference to FIG. 1. FIGS. 1-1(*a*) to (*e*) and FIGS. 1-2(*f*) to (*h*) are cross-sectional views schematically showing a production flow of the TFT in the present Embodiment. FIGS. 1-1 and 1-2 are cross-sectional views schematically showing the TFT in the channel length direction. The TFT in the present Embodiment has a substantially symmetric structure in the channel length direction. Therefore, FIGS. 1-1 and 1-2 show the structure on only one side of the TFT.

As shown in FIG. 1-1(*a*), on a glass substrate 1 that is an insulating substrate, a base coat (EC) layer 2 was first formed by a plasma CVD method and the like, and successively an amorphous silicon (a-Si) film 3 was formed to have a thickness of 50 nm. Examples of the BC layer 2 include a silicon oxide ($SiO_2$) film, a silicon nitride film (SiNx) film, and a silicon oxynitride (SiNO) film. A multilayer body of these films may be adopted. With respect to each raw material gas for the BC layer 2, for example, TEOS (tetraethoxysilane) is mentioned for the $SiO_2$ film; a mixed gas of monosilane ($SiH_4$) and ammonia ($NH_3$) is mentioned for the SiNx film; and a mixed gas of monosilane ($SiH_4$), nitrous oxide gas ($N_2O$) and nitrogen gas ($N_2$) is mentioned for the SiNO film. $Si_4$, $Si_2H_6$, and the like are mentioned as a raw material gas for the a-Si film 3.

Then, as shown in FIG. 1-1(*b*), a natural oxide film on the a-Si film 3 surface was removed by fluorinated acid and the like. The first laser irradiation was performed and the a-Si film 3 was crystallized inside the chamber under atmospheric pressure and a mixture gas of 80% by volume of nitrogen and 20% by volume of oxygen. XeCl excimer laser (wavelength: 308 nm) was used, and the beam shape on the silicon layer had a band shape with a width of 500 μm. The energy density of the laser irradiation was 430 $mJ/cm^2$, the pulse width was 25 ns, and the overlap ratio was 97%. The obtained polysilicon (p-Si) film 4 had projections along a grain boundary. A larger projection had a height of 50 nm. The p-Si film 4 including this projection had a surface roughness of about 10 nm. In the present Embodiment, the surface roughness means an arithmetic mean deviation (Ra) and it was calculated based on the measurement method in accordance with JIS B 0601 using an atomic force microscope (AMF).

Then, as shown in FIG. 1-1(*c*), the natural oxide film on the obtained p-Si film 4 surface was removed by fluorinated acid and the like. Then, the film was subjected to the second laser irradiation inside the chamber under atmospheric pressure and a nitrogen atmosphere. The second laser irradiation may be continuously performed after the first laser irradiation. The energy density of the second laser irradiation was 460 $mJ/cm^2$, and other conditions were the same as in the first laser irradiation. The projection on the p-Si film 4 surface became smaller by the second laser irradiation, and as a result, a p-Si flattened film 5 having a surface roughness of about 4 nm was obtained.

Then, as shown in FIG. 1-1(*d*), the p-Si flattened film 5 was patterned into an island shape by a photolithography method and the like. A small taper angle at the silicon pattern end might cause a parasitic transistor. In contrast, a large taper angle at the silicon pattern end reduces the coverage of the gate insulating film, which might causes insulating defects. In order to suppress them, it is preferable that the taper angle is 45° to 75° so that the taper angle is optimized.

As shown in FIG. 1-1(*e*), a multilayer film including a $SiO_2$ film 7 and a SiNx film 5 in this order from the glass substrate 1 side was formed as a gate insulating film 6 on the glass substrate 1 and the p-Si flattened film 5 by a plasma CVD method and the like. With respect to the film thickness, the SiNx film 8 had a thickness of 40 nm, and the $SiO_2$ film 7 had a thickness of 50 nm. The dielectric constant of the silicon nitride is twice as large as the dielectric constant of silicon oxide. Therefore, the equivalent oxide thickness of the gate insulating film 6 was about 70 nm. Thus, in the present Embodiment, a gate insulating film that is electrically sufficiently thinned was formed. The equivalent oxide thickness is a thickness calculated from a formula $T1+T2\times \in 1/\in 2$ where the thickness of the silicon oxide film is defined as T1, the dielectric constant of the silicon oxide is defined as $\in 1$, the film thickness of the film with a high dielectric constant (silicon nitride film in the present Embodiment) is defined as T2, and the dielectric constant of the material with a dielectric constant higher than that of silicon oxide (silicon nitride in the present Embodiment) is defined as $\in 2$. With respect to each raw material gas for the $SiO_2$ film 7 and the SiNx film 8, the same gases as mentioned in the step of forming the BC layer 2 are mentioned. It is preferable in the steps of forming the gate insulating film that the $SiO_2$ film 7 and the SiNx film 8 are continuously formed inside the same equipment (chamber) while vacuum is maintained. This is because the interface between the $SiO_2$ film 7 and the SiNx film 8 is contaminated and thereby a gate insulating film having excellent interface characteristics might not be formed if the films are discontinuously formed.

As shown in FIG. 1-2(*f*), a multilayer film consisting of tantalum nitride (TaN) and tungsten (W) from the glass substrate 1 side was formed by a sputtering method and the like and then patterned by a photolithography method and the like, thereby forming a gate electrode 9 to partly overlap with the p-Si flattened film 5. Successively, using the gate electrode 9 as a mask, n-type or p-type impurity ions were doped into the p-Si flattened film 5 in a self-aligning manner. Then, the substrate was heated at about 600° C., thereby activating dopants. As a result, an $n^+$ region or a $p^+$ region 10 was formed. Thereby, an $n^+$ region or $p^+$ region 10 served as a drain or a source, and the region facing the gate electrode 9 served as a channel 11. With respect to the impurity ion, a phosphorus ion and the like may be used as the n-type impurity ion, and a boron ion and the like may be used as the p-type impurity ion.

Then, as shown in FIG. 1-2(*g*), an inter layer insulating film 12 having a three-layer structure consisting of a $SiO_2$ film 7, a SiNx film 8 and a $SiO_2$ film 7 from the glass substrate 1 side was formed over the entire surface on the gate electrode 9 side of the glass substrate 1 by a plasma CVD method and the like. With respect to the raw material gas used for forming each film, the same gases as mentioned above may be used. Then, a contact hole 13 was formed in the region corresponding to the n+ region or p+ region of the inter layer insulating film 12 by anisotropic dry etching and the like.

As shown in FIG. 1-2(h), a conductive film having a three-layer structure consisting of a titanium film (Ti) film, an aluminum film (Al) film, and a titanium (Ti) film in this order from the glass substrate 1 side was formed inside the contact hole 13 and on the inter layer insulating film 12. Then, the film was patterned by a photolithography method and the like to form a source electrode or drain electrode 14. As a result, a TFT in Embodiment 1, including the p-Si flattened film and the gate insulating film that is a multilayer film consisting of a $SiO_2$ film having a thickness of 50 nm and a SiNx film having a thickness of 40 nm, was prepared.

Comparative Embodiment 1

Then, a TFT in Comparative Embodiment 1 is mentioned. The configuration of the TFT in the present Comparative Embodiment is the same as in Embodiment 1, except that the gate insulating film 6 that is a multilayer film consisting of the $SiO_2$ film 7 and the SiNx film 8 was changed into a $SiO_2$ single film 7 and the p-Si flattened film 5 was changed into a unflattened p-Si film 4. Other configurations are the same as in TFT of Embodiment 1. The $SiO_2$ film 7 that is the gate insulating film 6 had a thickness of 70 nm. In the present Comparative Embodiment, the TFT was produced in the same manner as in Embodiment 1, except that only the first laser irradiation was performed for crystallization of the silicon film and only a $SiO_2$ single film was formed as the gate insulating film. The first laser irradiation and the $SiO_2$ film formation were performed under the same conditions as in Embodiment 1. As a result, a TFT in Comparative Embodiment 1, including the unflattened p-Si film and the gate insulating film that is a $SiO_2$ single film having a thickness of 70 nm, was produced.

Comparative Embodiment 2

A TFT in Comparative Embodiment 2 is mentioned below. The TFT in the present Comparative Embodiment was produced in the same manner as in Comparative Embodiment 1, except that the second laser irradiation was performed and the p-Si film 4 was flattened and thereby the flattened p-Si film 5 was formed. The second laser irradiation was performed under the same conditions as in Embodiment 1. As a result, a TFT in Comparative Embodiment 2, including the flattened p-Si film and the gate insulating film that is a $SiO_2$ single film having a film thickness of 70 nm, was produced.

Comparative Embodiment 3

A TFT in Comparative Embodiment 3 is mentioned below. The TFT in the present Comparative Embodiment was produced in the same manner as in Comparative Embodiment 1, except that the gate insulating film was changed into a multilayer film consisting of a $SiO_2$ film 7 having a thickness of 50 nm and a SiNx film 8 having a thickness of 40 nm. The $SiO_2$ film and the SiNx film were formed under the same conditions as in Embodiment 1. As a result, a TFT in Comparative Embodiment 3, including the unflattened p-Si film and the gate insulating film that is a multilayer film consisting of a $SiO_2$ film having a thickness of 50 nm and a SiNx film having a thickness of 40 nm, was produced.

Experiments using the TFTs in Embodiment 1 and Comparative Embodiments 1 to 3 are mentioned below.

"Experiment 1"
Verification of Gate Leakage Current (Ig) Characteristics and Breakdown Voltage Relative to Gate Voltage (Vg)

FIG. 2 is a graph showing gate leakage current (Ig) characteristics and breakdown voltage relative to gate voltage (Vg) of the TFTs in Embodiment 1 and Comparative Embodiments 1 to 3. The following Table 1 shows comparative results of the breakdown voltage of the TFTs in Embodiment 1 and Comparative Embodiments 1 to 3. The results show that in the TFT in Embodiment 1 of the present invention, a remarkable reduction in gate leakage current and remarkable improvement in withstand voltage were observed, which can not be anticipated by the results in the cases where the treatment of flattening the p-Si film and the formation of the gate insulating film having a multilayer structure are singly performed. It appears that this can be realized because, in the TFT in Embodiment 1, the gate insulating film has excellent coverage for the upper and end parts of the p-Si pattern film. In FIG. 2, 1E–x (x is any value) represents $1 \times 10^{-x}$.

TABLE 1

| Gate insulating film structure | Breakdown voltage [V] Flattening treatment for polycrystal silicon film | |
|---|---|---|
| | Performed | Not performed |
| $SiO_2$ single film 70 nm | 26.0 (Comparative Embodiment 1) | 27.8 (Comparative Embodiment 2) |
| SiNx/$SiO_2$ multilayer film 40 nm/50 nm | 39.0 (Comparative Embodiment 3) | 54.0 (Embodiment 1) |

"Experiment 2"
Verification of Shift in Threshold (ΔVth) Before and After Applying the Gate Bias Stress Voltage FIG. 3 is a graph showing a shift in threshold (ΔVth) before and after applying the gate bias stress voltage to the TFTs in Embodiment 1 and Comparative Embodiment 3 in which the gate insulating film has a multilayer structure. The shift in threshold (ΔVth) was calculated by subtracting the threshold before the application from the threshold after applying the gate bias stress voltage for 10 sec. In the present Experiment, N-type TFTs were produced in Embodiment 1 and Comparative Embodiment 3 and the present Experiment was performed. As shown in FIG. 3, the reliability was improved in the TFT in Embodiment 1 in which the p-Si film was flattened because the shift in threshold accompanied with the application of the gate bias stress was reduced to half or less the shift in threshold of the TFT in Comparative Embodiment 3 in which the p-Si film was unflattened. This shows that if the multilayer gate insulating film effective in improvement in breakdown voltage is formed on the flattened polycrystal semiconductor film such as the p-Si flattened film, the TFT having a high breakdown voltage and high reliability is formed.

This Nonprovisional application claims priority under the Paris Convention and the domestic law in the country to be entered into national phase on Patent Application No. 2005-319834 filed in Japan on Nov. 2, 2005, the entire contents of which are hereby incorporated by reference.

The terms "or more" and "or less" include the described values, respectively.

BRIEF DESCRIPTION OF DRAWINGS

FIGS. 1-1(a) to (e) are cross-sectional views showing the first production flow of the thin film transistor in Embodiment 1.

FIGS. 1-2(f) to (h) are cross-sectional views showing the second production flow of the thin film transistor in Embodiment 1.

FIG. 2 is a graph showing gate leakage current (Ig) characteristics and a breakage voltage relative to a gate voltage (Vg) in Embodiment 1 and Comparative Embodiments 1 to 3.

EXPLANATION OF NUMERALS AND SYMBOLS

Figure 1:
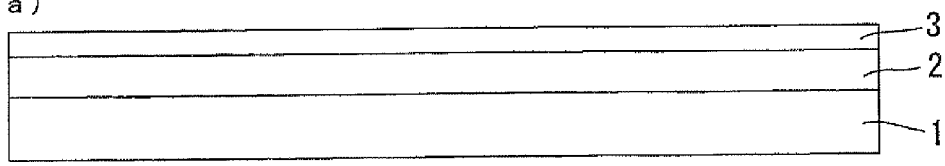
Figure 1:
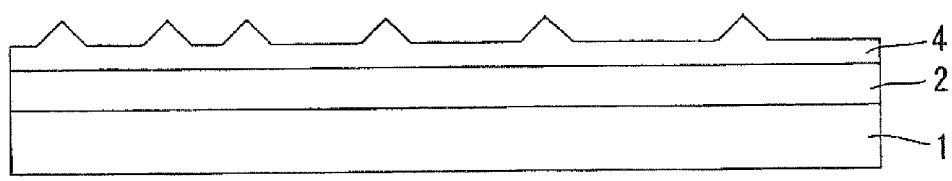
Figure 1:
Figure 1:
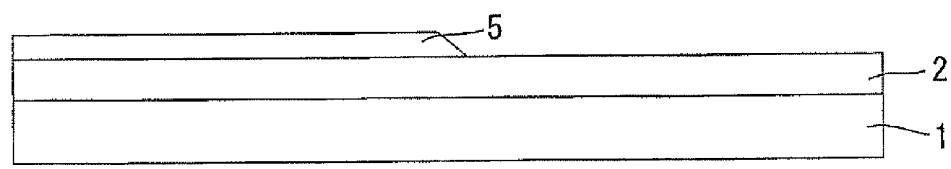
Figure 1:
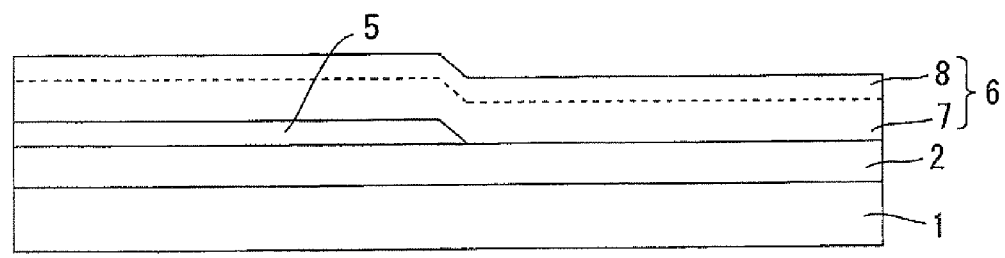
Figures 1, 2:
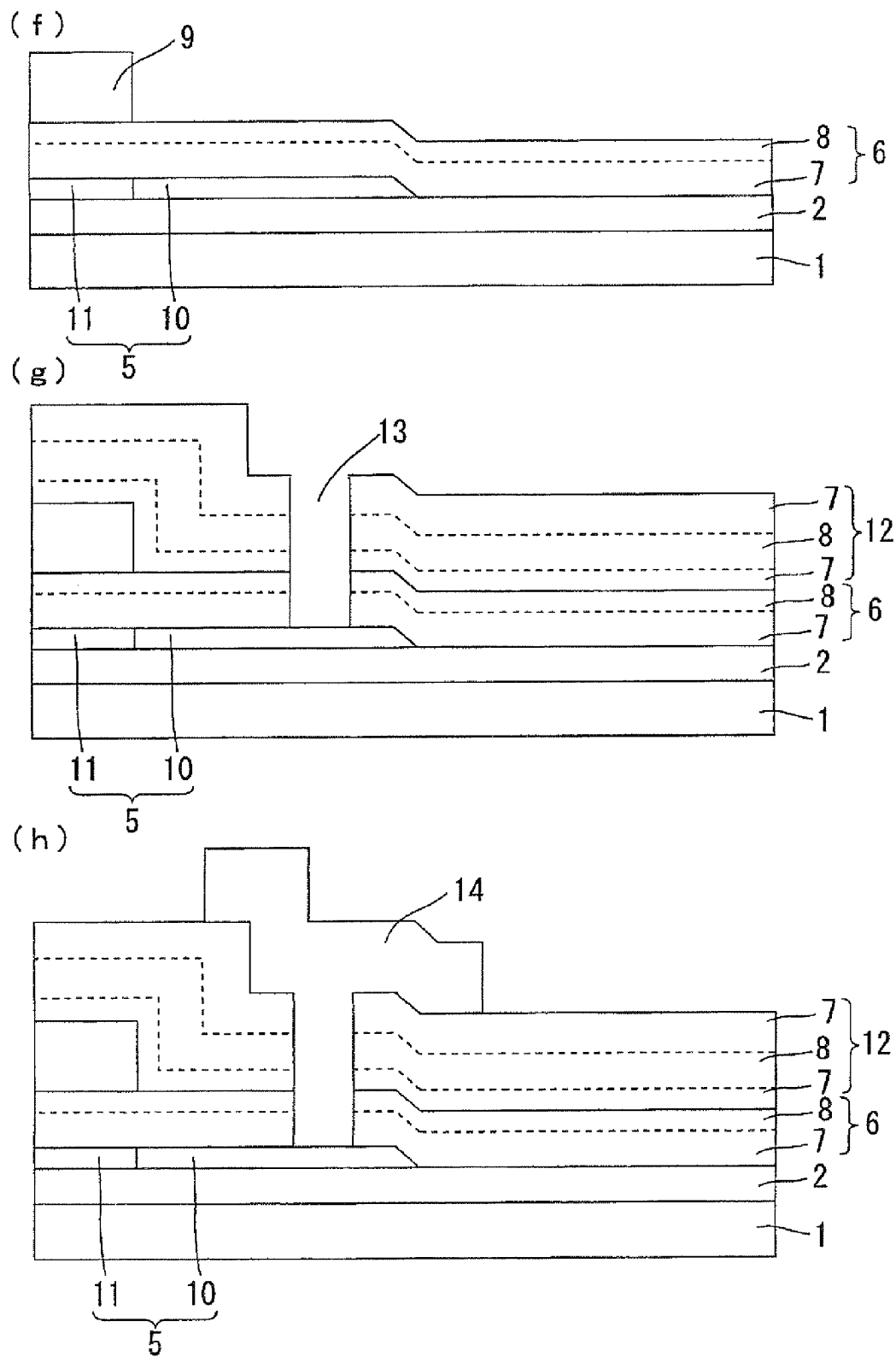
Figure 2:
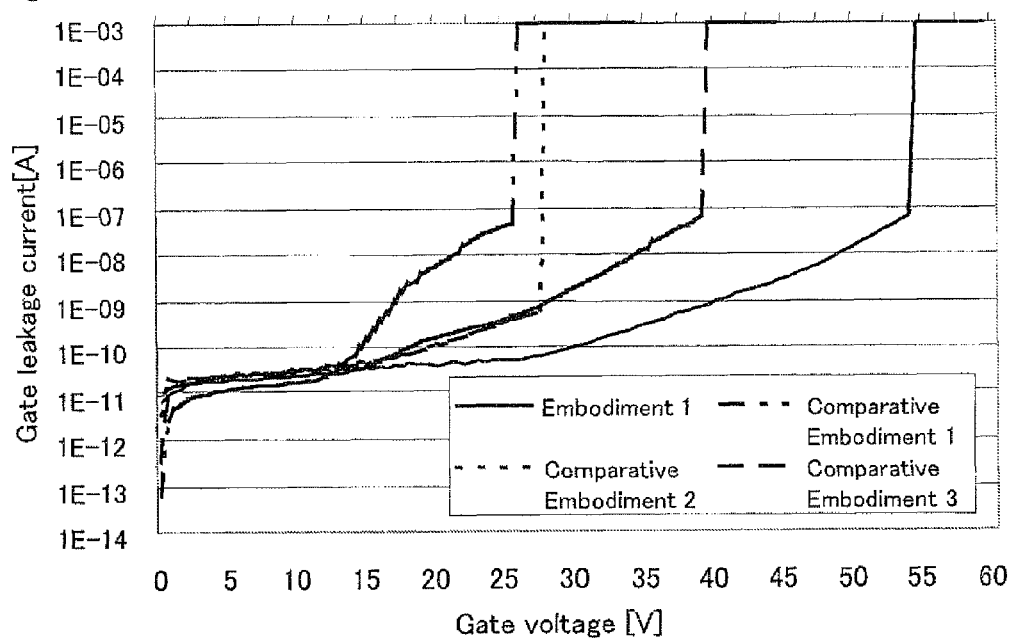
Figure 3:
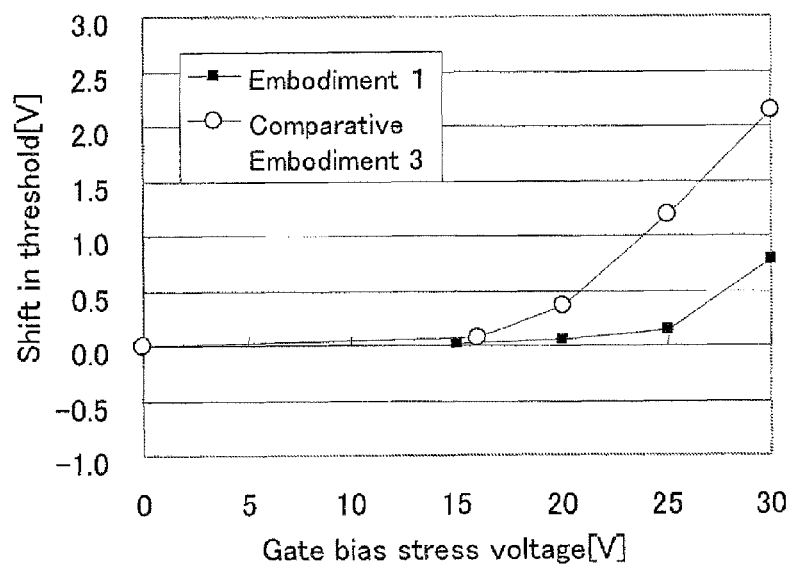
FIG. 3 is a graph showing a shift in threshold (ΔVth) before and after applying the gate bias stress in Embodiment 1 and Comparative Embodiment 2.

1: Glass substrate
2: Base coat (BC) layer
3: Amorphous silicon (a-Si) film
4: Polysilicon (p-Si) film
5: Polysilicon (p-Si) flattened film
6: Gate insulating film
7: Silicon oxide ($SiO_2$) film
8: Silicon nitride (SiNx) film
9: Gate electrode
10: $n^+$ region or $p^+$ region
11: Channel
12: Inter layer insulating film
13: Contact hole
14: Source electrode or drain electrode

The invention claimed is:

1. A semiconductor device, comprising:
a polycrystal semiconductor layer, a gate insulating film, and a gate electrode, stacked on an insulating substrate in this order,
wherein the polycrystal semiconductor layer has a surface roughness of 9 nm or less,
wherein the gate insulating film has a multilayer structure including a silicon oxide film on a polycrystal semiconductor layer side and a film containing a material with a dielectric constant higher than a dielectric constant of silicon oxide on a gate electrode side, and
wherein the polycrystal semiconductor layer has a forward tapered cross section with a taper angle of 45° or more.

2. The semiconductor device according to claim 1, wherein the film containing a material with a dielectric constant higher than a dielectric constant of silicon oxide is a silicon nitride film.

3. The semiconductor device according to claim 1, wherein the silicon oxide film has a thickness larger than a thickness of the film containing a material with a dielectric constant higher than a dielectric constant of silicon oxide in a region where the polycrystal semiconductor layer faces the gate electrode.

4. The semiconductor device according to claim 1, wherein the taper angle is 75° or less.

5. A display device comprising the semiconductor device of claim 1.

6. The display device according to claim 5, wherein the display device is a liquid crystal display device.

7. A semiconductor device, comprising:
a polycrystal semiconductor layer formed on an insulating substrate;
a first insulating layer of a multilayer gate insulating film formed on the polycrystal semiconductor layer, the first layer being a silicon oxide layer;
a second insulating layer of the multilayer gate insulating film formed on the first insulating layer; and
a gate electrode formed on the gate insulating film,
wherein the polycrystal semiconductor has a surface roughness of 9 nm or less,
wherein a dielectric constant of the second insulating layer is higher than a dielectric constant of the first insulating layer,
wherein the first insulating layer is thicker than the second insulating layer, and
wherein the polycrystal semiconductor layer has a forward tapered cross section with a taper angle that substantially ranges between 45° and 75°.

8. The semiconductor device according to claim 7, wherein a thickness ratio of the first insulating layer relative to the second insulating layer is substantially 1.2 or greater.

9. The semiconductor device according to claim 7, wherein a dielectric constant ratio of the second insulating layer relative to the first insulating layer is substantially 1.5 or greater.

10. A method for producing the semiconductor device, the method comprising:
forming a polycrystal semiconductor layer on an insulating substrate;
forming a gate insulating film on the polycrystal semiconductor layer; and
forming a gate electrode on the gate insulating film,
wherein the polycrystal semiconductor has a forward tapered cross section with a taper angle of 45° or more, and has a surface roughness of 9 nm or less, and
wherein the gate insulating film has a multilayer structure including a silicon oxide film on a polycrystal semiconductor layer side and a film containing a material with a dielectric constant higher than a dielectric constant of silicon oxide on a gate electrode side.

11. The method for producing the semiconductor device according to claim 10, wherein the taper angle is 75° or less.

12. The method for producing the semiconductor device of claim 10, wherein the step of forming the polycrystal semiconductor layer comprises crystallizing an amorphous semiconductor layer with laser.

13. The method for producing the semiconductor device according to claim 12, wherein laser irradiation is performed at least twice in the crystallization step.

14. The method for producing the semiconductor device of claim 10, wherein the step of forming the gate insulating film having the multilayer structure comprises continuously forming the gate insulating film in a same equipment while vacuum is maintained.

* * * * *